United States Patent
Sun et al.

(10) Patent No.: US 12,230,499 B2
(45) Date of Patent: Feb. 18, 2025

(54) METHODS OF POST TREATING SILICON NITRIDE BASED DIELECTRIC FILMS WITH HIGH ENERGY LOW DOSE PLASMA

(71) Applicant: Applied Materials, Inc., Santa Clara, CA (US)

(72) Inventors: Yong Sun, San Jose, CA (US); Jung Chan Lee, San Jose, CA (US); Shuchi Sunil Ojha, Redwood City, CA (US); Praket Prakash Jha, San Jose, CA (US); Jingmei Liang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 614 days.

(21) Appl. No.: 16/892,990

(22) Filed: Jun. 4, 2020

(65) Prior Publication Data
US 2020/0388483 A1     Dec. 10, 2020

Related U.S. Application Data

(60) Provisional application No. 62/858,158, filed on Jun. 6, 2019.

(51) Int. Cl.
   *H01L 21/02*     (2006.01)

(52) U.S. Cl.
   CPC ...... *H01L 21/0234* (2013.01); *H01L 21/0217* (2013.01); *H01L 21/02208* (2013.01)

(58) Field of Classification Search
None
See application file for complete search history.

(56) References Cited

U.S. PATENT DOCUMENTS

| 8,084,356 B2 | 12/2011 | Dordi et al. |
| 9,214,333 B1 | 12/2015 | Sims et al. |
| 2005/0159017 A1 | 7/2005 | Kim et al. |

(Continued)

FOREIGN PATENT DOCUMENTS

| JP | 2005203800 A | 7/2005 |
| JP | 2005524983 A | 8/2005 |

(Continued)

OTHER PUBLICATIONS

Martirosyan (J. Vac. Sci. Technol. A 36(4), Jul./Aug. 2018) (Year: 2018).*

(Continued)

*Primary Examiner* — Bret P Chen
(74) *Attorney, Agent, or Firm* — Patterson + Sheridan, LLP

(57) ABSTRACT

A method of post-treating a silicon nitride (SiN)-based dielectric film formed on a surface of a substrate includes positioning a substrate having a silicon nitride (SiN)-based dielectric film formed thereon in a processing chamber, and exposing the silicon nitride (SiN)-based dielectric film to helium-containing high-energy low-dose plasma in the processing chamber. Energy of helium ions in the helium-containing high-energy low-dose plasma is between 1 eV and 3.01 eV, and flux density of the helium ions in the helium-containing high-energy low-dose plasma is between $5 \times 10^{15}$ ions/cm²·sec and $1.37 \times 10^{16}$ ions/cm²·sec.

19 Claims, 8 Drawing Sheets

(56) References Cited

U.S. PATENT DOCUMENTS

| | | | | |
|---|---|---|---|---|
| 2006/0124612 A1* | 6/2006 | Kong | ............... | H01J 37/32091 |
| | | | | 219/121.36 |
| 2006/0260545 A1* | 11/2006 | Ramaswamy | .......... | C23C 16/26 |
| | | | | 156/345.31 |
| 2011/0236594 A1* | 9/2011 | Haverkamp | .......... | C23C 16/345 |
| | | | | 118/723 R |
| 2011/0236600 A1* | 9/2011 | Fox | .................... | C23C 16/4401 |
| | | | | 427/579 |
| 2012/0196450 A1 | 8/2012 | Balseanu | | |
| 2013/0217241 A1* | 8/2013 | Underwood | ...... | H01L 21/02216 |
| | | | | 438/778 |
| 2016/0203942 A1* | 7/2016 | Russo | .............. | G01N 33/54393 |
| | | | | 250/307 |
| 2018/0182613 A1* | 6/2018 | Blanquart | ......... | H01L 21/02592 |

FOREIGN PATENT DOCUMENTS

| | | | |
|---|---|---|---|
| JP | 2006505928 A | 2/2006 | |
| JP | 2007251172 A | 9/2007 | |
| JP | 2008010877 A | 1/2008 | |
| JP | 2010512646 A | 4/2010 | |
| JP | 2010232240 A | 10/2010 | |
| JP | 2012084707 A | 4/2012 | |
| JP | 2014522104 A | 8/2014 | |
| JP | 2016-511551 A | 4/2016 | |
| JP | 2016066794 A | 4/2016 | |
| JP | 2016523442 A | 8/2016 | |
| JP | 2019121657 A | 7/2019 | |
| TW | 201327671 A | 7/2013 | |
| TW | 201723213 A | 7/2017 | |
| WO | 2006127462 A2 | 11/2006 | |
| WO | WO-2017112732 A1 * | 6/2017 | ............. C23C 16/50 |
| WO | 2019/060069 A1 | 3/2019 | |

OTHER PUBLICATIONS

Tanyeli, Irem, et al., "Surface Modifications Induced by High Fluxes of Low Energy Helium Ions". Scientific Reports 5: 9779, Apr. 2015, pp. 1-9.*

International Search Report dated Sep. 16, 2020 for Application No. PCT/US2020/035970.

Taiwan Office Action dated Aug. 20, 2024 for Application No. 109118885.

Singapore Search Report Application No. 11202112611P dated Dec. 19, 2023.

Notice for Reasons for Rejection dated Mar. 12, 2024 re: JP Application No. 2021-572329.

* cited by examiner

METHODS OF POST TREATING SILICON NITRIDE BASED DIELECTRIC FILMS WITH HIGH ENERGY LOW DOSE PLASMA

CROSS-REFERENCE TO RELATED APPLICATIONS

This application claims the benefit to U.S. Provisional Application No. 62/858,158, filed Jun. 6, 2019, which is incorporated by reference herein.

BACKGROUND

Field

Embodiments of the present disclosure generally relate to flowable gap-fill films and fabrication processes thereof, and more specifically, to post-treating flowable films by high-energy low-dose plasma.

Description of the Related Art

Fabrication of miniaturized semiconductor devices, including shallow trench isolation (STI), inter-metal dielectric (IMD) layers, inter-layer dielectric (ILD) layers, pre-metal dielectric (PMD) layers, passivation layers, fin-field-effective-transistors (FinFET), and the like, faces challenges in advanced lithography for patterning nano-scaled gate structures. Silicon nitride is one of primary dielectric materials used in such structures. Void-free filling of gaps and trenches has been performed by flowable chemical vapor deposition (CVD), in which silicon-and-nitrogen containing dielectric precursor in a liquid phase is delivered into gaps and trenches on a substrate (referred to as a flowable film), and then hardened into a silicon nitride (SiN)-based dielectric film in a solid phase, conventionally by steam annealing, ultraviolet (UV) irradiation, hot pressing, and sintering at high temperatures. However, such solidification processes are limited to a certain depth within high aspect ratio features and thus the features are not fully filled with a silicon nitride (SiN)-based dielectric film. In some instances, flowable films are treated with standard high-density plasma (HDP) containing high-energy ions to increase the solidification depth. However, it is known such HDP treatment does not penetrate into a silicon nitride (SiN)-based dielectric film, and does not increase the solidification depth to a depth of high aspect ratio features. Therefore, wet etch selectivity of the material within the high aspect ratio features (containing silicon nitride partially) over silicon oxide is less than that of silicon nitride over silicon oxide.

Therefore, a new solidification process is needed to form flowable films that fill high aspect ratio gaps and trenches and have improved mechanical properties, such as an improved wet etch rate (WERR, <2:1), relative to silicon oxide.

SUMMARY

Embodiments described herein generally relate to a method of post-treating a silicon nitride (SiN)-based dielectric film formed on a surface of a substrate that includes positioning a substrate having a silicon nitride (SiN)-based dielectric film formed thereon in a processing chamber, and exposing the silicon nitride (SiN)-based dielectric film to helium-containing high-energy low-dose plasma in the processing chamber. Energy of helium ions in the helium-containing high-energy low-dose plasma is between 1 eV and 3.01 eV, and flux density of the helium ions in the helium-containing high-energy low-dose plasma is between $5 \times 10^{15}$ ions/cm$^2$·sec and $10.37 \times 10^{16}$ ions/cm$^2$·sec.

Embodiments of the disclosure may further provide a method of forming and post-treating a silicon nitride (SiN)-based dielectric film on a surface of a substrate that includes delivering a dielectric precursor onto a substrate disposed in a processing region of a first chamber, the dielectric precursor comprising silicon and nitrogen, providing radical flux in the processing region of the first chamber, and exposing the delivered dielectric precursor to helium-containing high-energy low-dose plasma in a second chamber. Energy of helium ions in the helium-containing high-energy low-dose plasma is between 1 eV and 3.01 eV, and flux density of the helium ions in the helium-containing high-energy low-dose plasma is between $5 \times 10^{15}$ ions/cm$^2$ and $10.37 \times 10^{16}$ ions/cm$^2$·sec.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments described herein provide methods of post-treating a silicon nitride (SiN)-based dielectric film deposited on a substrate, for example, by flowable chemical vapor deposition (CVD). A silicon nitride (SiN)-based dielectric film contains silicon-nitrogen (Si—N—Si) bonds. A silicon nitride (SiN)-based dielectric film, as deposited on the substrate, may contain a large amount of silicon-hydrogen (Si—H) and nitrogen-hydrogen (N—H) bonds as a result of cross-linking of Si—H limited to near a surface of the deposited silicon nitrogen (Si—N)-based dielectric film, causing insufficient filling of gaps and trenches. The methods described herein include post-treating a silicon nitride (SiN)-based dielectric film as deposited on a surface of a substrate by exposing the deposited silicon nitride (SiN)-based dielectric film to helium-containing high-energy low-dose plasma. The methods described herein can be used to reduce or eliminate Si—H and N—H bonds in silicon nitride (SiN)-based dielectric films to densify the silicon nitride (SiN)-based dielectric film to a large thickness.

Embodiments described herein also provide methods of forming a silicon nitride (SiN)-based dielectric film by flowable CVD to fill gaps and trenches having high aspect ratio (AR) and small dimensions (e.g., AR≥8). In some embodiments, silicon nitride (SiN)-based dielectric films formed by flowable CVD are seam-free and can fill up high AR gaps and trenches using a silicon-and-nitrogen dielectric precursor in a liquid phase and radical forms of co-reactants (reactive gas), for example, oxygen ($O_2$) or ammonia ($NH_3$).

Figure 1:
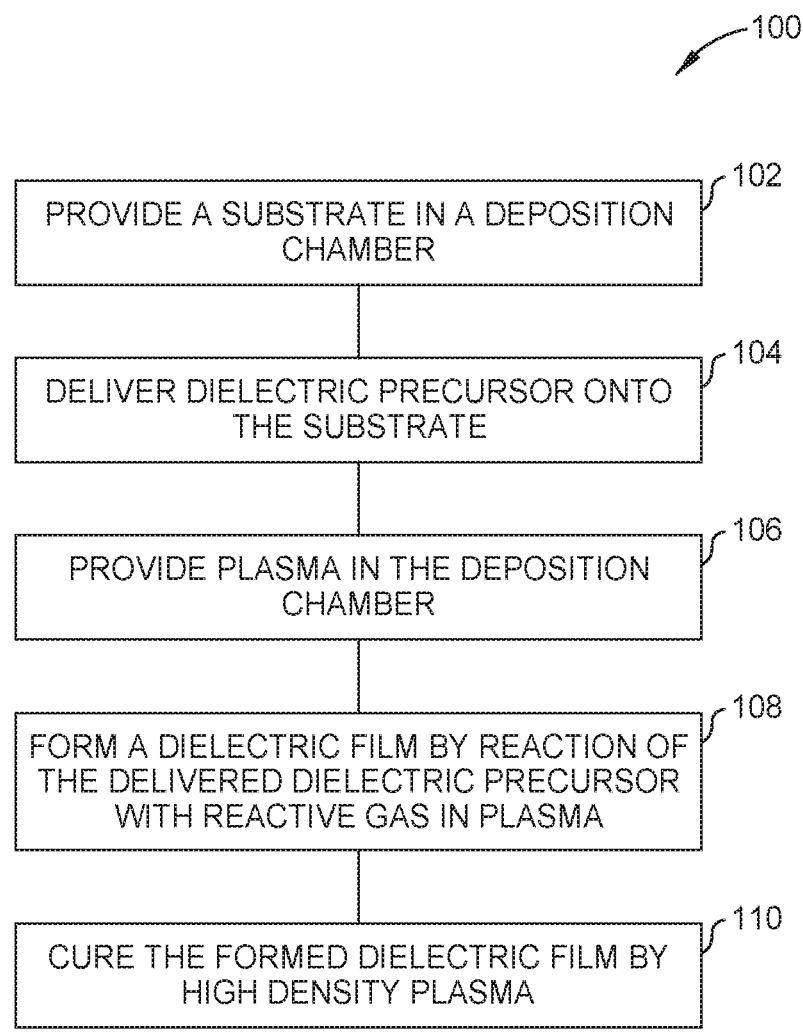
FIG. 1 is a flowchart showing a method of forming flowable films according to one embodiment.

FIG. 1 is a flowchart illustrating a method 100 that is used to form a silicon nitride (SiN)-based dielectric film on a surface of a substrate, according to one embodiment.

In block 102, a substrate is positioned in a deposition chamber. A substrate, for example, may be a metal substrate, such as aluminum or stainless steel, a semiconductor substrate, such as silicon, silicon-on-insulator (SOI), or gallium arsenide, a glass substrate, or a plastic substrate. A semiconductor substrate may be a patterned substrate at any stage of manufacture/fabrication in the formation of integrated circuits. The patterned substrate may include gaps, trenches, holes, vias, or the like, that are to be filled with dielectric material.

In block 104, one or more dielectric precursors in a liquid phase and a carrier gas, such as argon (Ar) or helium (He), are flowed into the deposition chamber via a gas delivery device, such as a dual channel showerhead (DCSH), to deliver the dielectric precursor onto a surface of the substrate disposed within the deposition chamber at a flow rate between about 250 sccm and about 5000 sccm per channel of the DSCH. The surface of the substrate can be held at a reduced temperature of between about 40° C. and about 150° C., for example at about 80° C. A pressure of the deposition chamber may be maintained between about 0.5 Torr and about 3.0 Torr.

In some embodiments, the dielectric precursor is an organosilicon compound that includes silicon, nitrogen, hydrogen, and chlorine, such as silyl-amine and its derivatives including trisilylamine (TSA) and disilylamine (DSA), an organosilicon compound that includes silicon, nitrogen, hydrogen, and oxygen, or a combination thereof.

In block 106, a plasma may be generated in a remote plasma source (RPS) outside the deposition chamber and flowed into a substrate processing region of the deposition chamber along with a carrier gas (e.g., Ar, He). The plasma can be generated by the dissociation of a processing precursor gas including molecular oxygen ($O_2$), ozone ($O_3$), molecular hydrogen ($H_2$), a nitrogen-hydrogen compound (e.g., $NH_3$, $N_2H_4$) a nitrogen-oxygen compound (e.g., NO, $NO_2$, $N_2O$), a hydrogen-oxygen compound (e.g., $H_2O$, $H_2O_2$), a nitrogen-hydrogen-oxygen compound (e.g., $NH_4OH$), a carbon-oxygen compound (e.g., CO, $CO_2$), or a combination thereof. In the plasma, O*, H*, and/or N*-containing radicals may be activated, such as O*, H*, N*, $NH_3$*, $N_2H_4$*, $NH_2$*, NH*, N*O*, $C_3H_6$*, $C_2H_2$*, or a combination thereof.

In some embodiments, the radicals activated in the RPS are flowed into the deposition chamber (referred to as "radical flux") at a flow rate between about 1 sccm and about 10000 sccm.

In block 108, one or more radicals (also referred to as reactive gas) in the substrate processing region react with the delivered dielectric precursor to form a silicon nitride (SiN)-based dielectric film. The composition of the formed silicon nitride (Si—N)-based dielectric film can be adjusted by changing the composition of the reactive gas in the radical flux. To form a nitrogen-containing film, such as SiON, SiCON, and SiN films, the reactive gas may be, for example, ammonia ($NH_3$), hydrogen ($H_2$), hydrazine ($N_2H_4$), nitrogen dioxide ($NO_2$), or nitrogen ($N_2$). When the reactive gas in the substrate processing region reacts with the delivered dielectric precursor, Si—H and N—H bonds (weaker bonds) are partially broken and replaced by Si—N, Si—NH, and/or Si—$NH_2$ bonds (stronger bonds) to form a silicon nitride (SiN)-dielectric film.

In block 110, the formed silicon nitride (SiN)-based dielectric film is exposed to high-energy low-dose plasma containing light ions (i.e., ionized species having small atomic numbers in the periodic table), such as helium (He), hydrogen ($H_2$), argon (Ar), or nitrogen ($N_2$) in a plasma chamber, to cure the formed silicon nitride (SiN)-based dielectric film. The plasma chamber is coupled to two power sources, an RF power source, which controls density of ion flux (also referred to as ion dose), via inductive coils and a RF power source, which controls ion energy.

The exposure to the light-ion-containing high-energy low-dose plasma causes further cross-linking between compounds having S—H and N—H bonds in the formed silicon nitride (SiN)-based dielectric film. That is, when the S—H and N—H bonds in adjacent compounds in the formed silicon nitride (SiN)-based dielectric film react with the light-ion-containing plasma, the adjacent compounds cross-link by removing S—H bonds and forming Si—N, Si—NH, and/or Si—$NH_2$ bonds, and thus corresponding portion of the silicon nitride (SiN)-based dielectric film is solidified.

While not intending to be bound by theory, it is believed that radicals of ions activated in the plasma may physically bombard Si—H bonds within the silicon nitride (SiN)-based dielectric film, thereby breaking the Si—H bonds and causing formation of Si—N, Si—NH, and/or Si—$NH_2$ bonds. The light ions travel through the formed silicon nitride (SiN)-based dielectric film to a selected depth without substantially damaging the formed silicon nitride (SiN)-based dielectric film. This treatment by radicals of the light ions makes it possible to perform the nitridation process (i.e., forming Si—N, Si—NH, and/or Si—$NH_2$ bonds) with homogeneity to a depth ranging from 0 nm to 4.2 nm without damaging the formed silicon nitride (SiN)-based dielectric film, while curing by, for example, thermal annealing or UV irradiation, inevitably is limited to curing near an exposed surface of the silicon nitride (SiN)-based dielectric film.

Typically, while not intending to be limiting, the curing the dielectric precursor (block 110) is performed in a chamber (the plasma chamber) different from the deposition chamber in which the delivery and reaction of the dielectric precursor with the reactive gas (blocks 104-108) are performed. In general, the set of operations (e.g. blocks 104-108) may be repeated for multiple cycles to form an overall thicker film.

Figure 2:
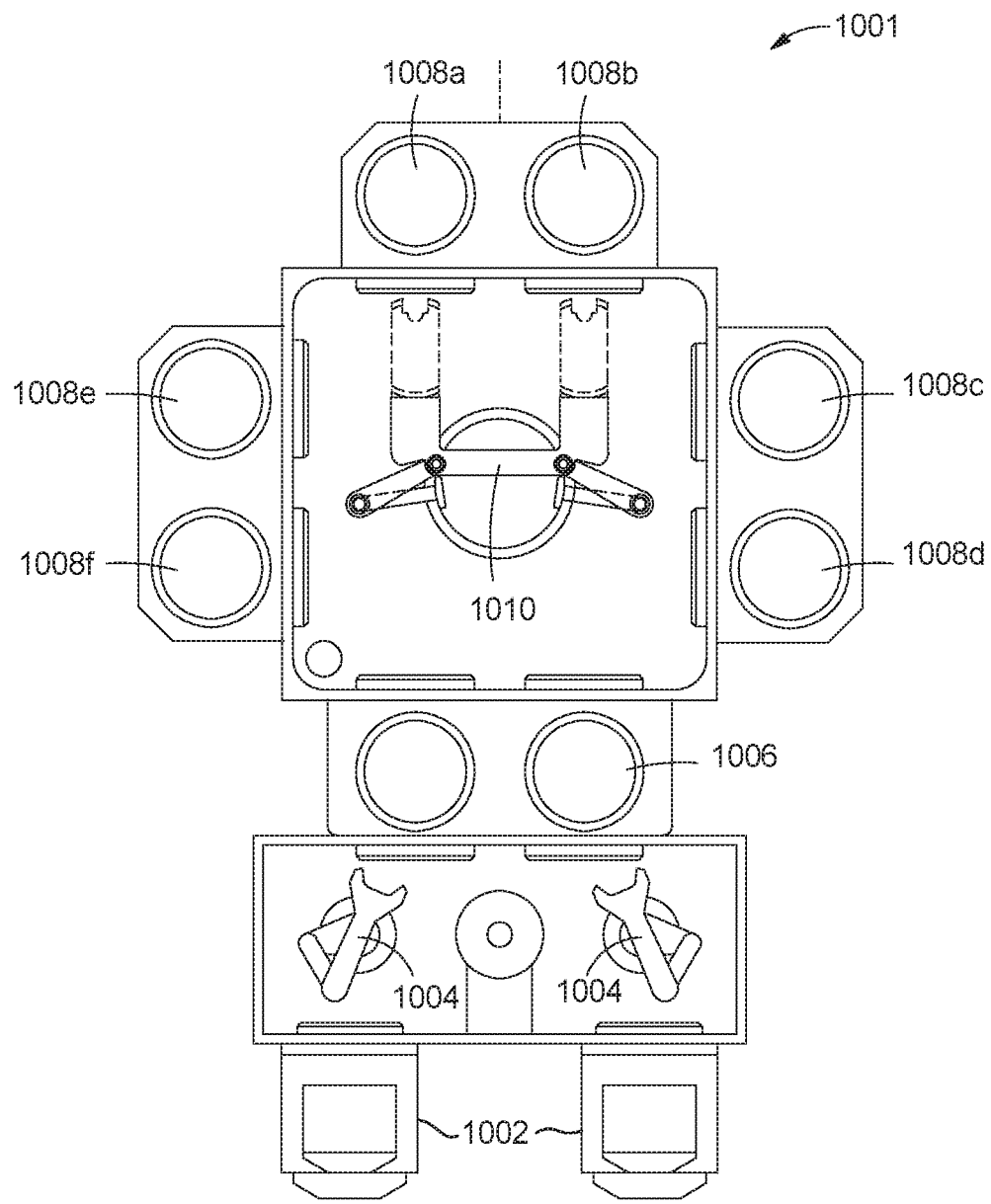
FIG. 2 is a schematic view of a cluster tool according to according to one embodiment.

Embodiments of the deposition systems may be incorporated into larger fabrication systems for producing integrated circuit chips. FIG. 2 shows one such cluster tool 1001 that includes processing chambers 1008a-f, according to one embodiment. In FIG. 2, a pair of front opening unified pods (FOUPs) 1002 supply substrates (e.g., 300 mm diameter wafers) that are received by robotic arms 1004 and placed into a low pressure holding area 1006. A second robotic arm 1010 may be used to transport the substrate between the lower pressure holding area 1006 and the processing chambers 1008a-f.

Figure 3A:
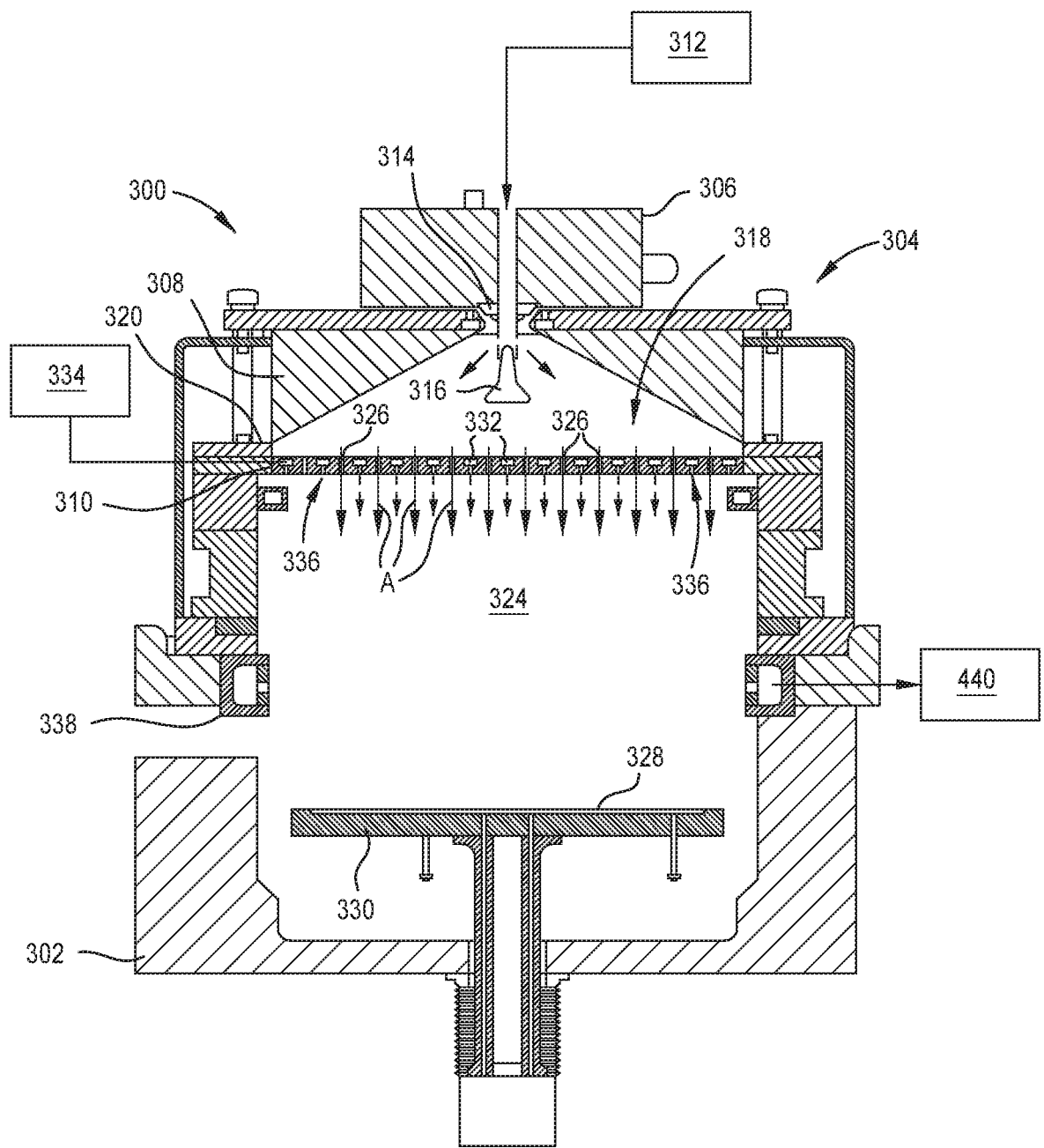
FIG. 3A is a schematic view of a deposition chamber according to one embodiment.

FIG. 3A is a schematic view of a processing chamber 300 having a chamber body 302 and lid assembly 304, according to one embodiment. The lid assembly 304 generally includes a remote plasma source (RPS) 306, a lid 308, and a dual channel showerhead (DCSH) 310. The RPS 306 may process a processing precursor gas provided from a processing precursor gas source 312. The plasma formed in the RPS 306 may be then delivered through a gas inlet assembly 314 and baffle 316, which are coupled to the lid 308, and into a chamber plasma region 318. A carrier gas (e.g., Ar, He) may be delivered into the chamber plasma region 318. The lid (that is a conductive top portion) 308 and the dual channel showerhead (DCSH) 310 are disposed with an insulating ring 320 in between, which allows an AC potential to be applied to the lid 308 relative to the DCSH 310.

The DCSH 310 is disposed between the chamber plasma region 318 and a substrate processing region 324 and allows radicals activated in the plasma present within the chamber plasma region 318 to pass through a plurality of through-holes 326 into the substrate processing region 324. The flow of the radicals (radical flux) is indicated by the solid arrows "A" in FIG. 3A. A substrate 328 is disposed on a substrate support 330 disposed within the substrate processing region 324. The DCSH 310 also has one or more hollow volumes 332 which can be filled with a dielectric precursor provided from a precursor source 334. The dielectric precursor passes from the one or more hollow volumes 332 through small holes 336 and into the substrate processing region 324, bypassing the chamber plasma region 318. The flow of the dielectric precursor is indicated by the dotted arrows in FIG. 3A. An exhaust ring 338 is used to uniformly evacuate the substrate processing region 324 by use of an exhaust pump 340. The DCSH 310 may be thicker than the length of the smallest diameter of the through-holes 326. The length of the smallest diameter of the through-holes 326 may be restricted by forming larger diameter portions of through-holes 326 partially through the DCSH 310, to maintain a flow of radical flux from the chamber plasma region 318 into the substrate processing region 324. In some embodiments, the length of the smallest diameter of the through-holes 326 may be the same order of magnitude as the smallest diameter of the through-holes 326 or less.

In some embodiments, a pair of processing chambers (e.g., 1008c-d) in FIG. 2 (referred to as a twin chamber) may be used to deposit a dielectric precursor on the substrate. Each of the processing chambers (e.g., 1008c-d) can have a cross-sectional structure of the processing chamber 300 depicted in FIG. 3A. The flow rates per channel of the DCSH described above correspond to flow rates into each of the chambers (e.g., 1008c-d) via the corresponding DCSH 310.

Figure 3B:
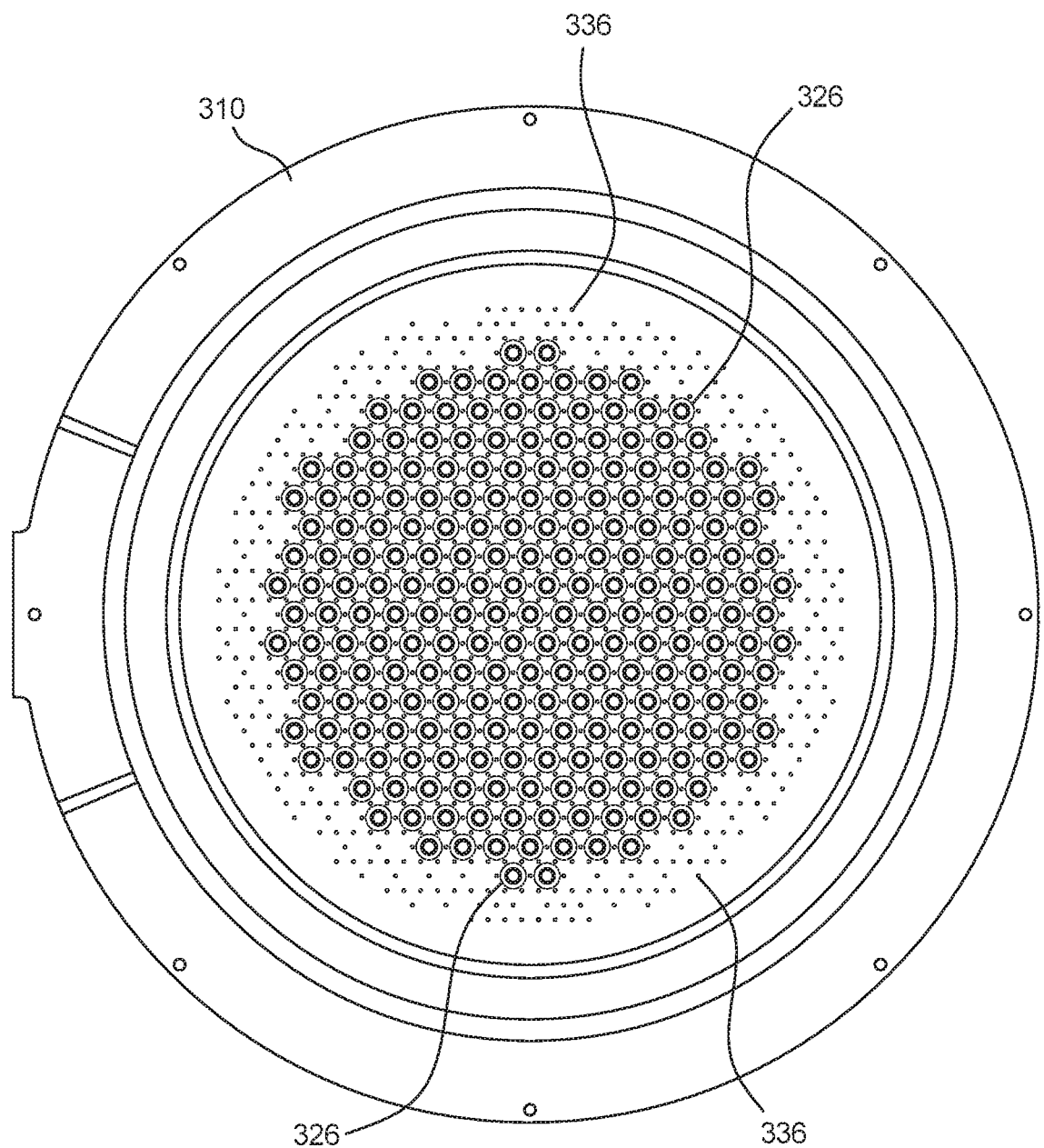
FIG. 3B is a schematic bottom view of a shower head according to one embodiment.

FIG. 3B is a schematic bottom view of the DCSH 310 according to one embodiment. The DCSH 310 may deliver via through-holes 326 the radical flux and the carrier gas present within the chamber plasma region 318.

In some embodiments, the number of through-holes 326 may be between about 60 and about 2000. Through-holes 326 may have round shapes or a variety of shapes. In some embodiments, the smallest diameter of through-holes 326 may be between about 0.5 mm and about 20 mm or between about 1 mm and about 6 mm. The cross-sectional shape of through-holes 326 may be made conical, cylindrical or a combination of the two shapes. In some embodiments, a number of small holes 336 may be used to introduce a dielectric precursor into the substrate processing region 324 and may be between about 100 and about 5000 or between about 500 and about 2000. The diameter of the small holes 336 may be between about 0.1 mm and about 2 mm.

Figure 4:
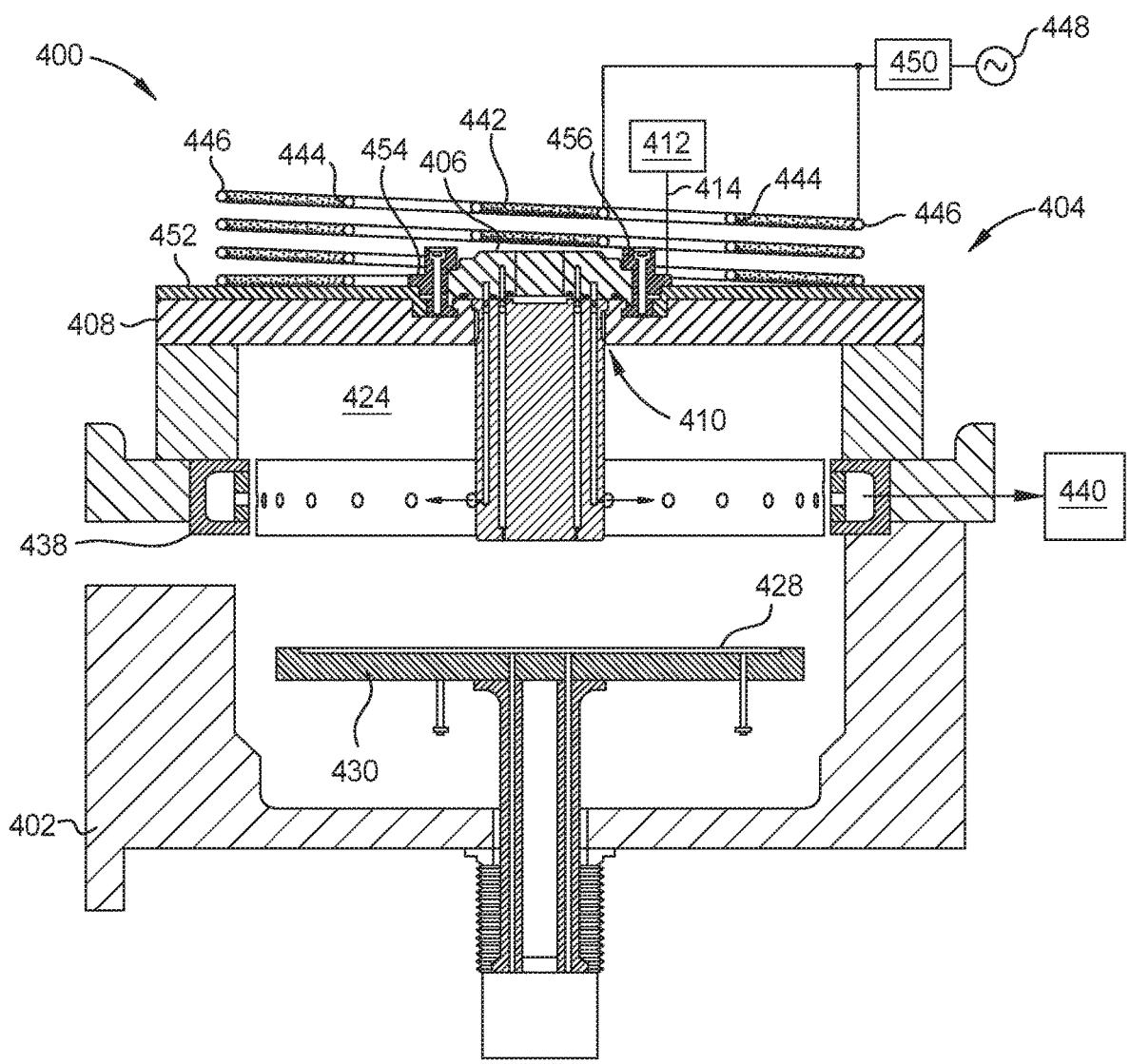
FIG. 4 is a schematic view of a plasma chamber according to one embodiment.

FIG. 4 is a schematic view of a plasma chamber 400 having a chamber body 402 and lid assembly 404, according to one embodiment. The lid assembly 404 includes a gas delivery assembly 406 and a lid 408. The lid 408 has an opening 410 to allow entrance of one or more processing precursor gases. The gas delivery assembly 406 is disposed over the lid 408 through the opening 410. The gas delivery assembly 406 may be connected to a gas source 412 through a gas inlet 414 to supply one or more processing precursor gases into a substrate processing region 424. A substrate 428 is disposed on a substrate support 430 disposed within the substrate processing region 424 and coupled to a bias power source (not shown). The one or more processing precursor gases may exit the substrate processing region 424 by use of an exhaust ring 438 and an exhaust pump 440.

In the lid assembly 404, inner coils 442, middle coils 444, and outer coils 446 are disposed over the lid 408. The inner cods 442 and the outer cods 446 are coupled to an RF power source 448 through a matching circuit 450. Power applied to the outer cods 446 from the RF power source 448 is inductively coupled through the lid 408 to generate plasma from the processing precursor gases provided from the gas source 412 within the substrate processing region 424. The RF power source 448 can provide current at different frequencies to control the plasma density (i.e., number of ions per cc) in the plasma and thus the density of ion flux (ions/cm²-sec). The bias power source controls a voltage between the substrate 428 and the plasma, and thus controls the energy and directionality of the ions. Thus, both ion flux and ion energy can be independently controlled.

A heater assembly 452 may be disposed over the lid 408. The heater assembly 452 may be secured to the lid 408 by clamping members 454, 456.

The surface of the substrate can be held at a temperature of between about 100° C. and about 400° C. A pressure of the plasma chamber may be maintained between about 5 mTorr and about 500 mTorr.

In the following, experimental measurements of process parameters used to process a deposited film are provided as an example to illustrate aspects of the embodiments of the disclosure described herein. These examples are not intended to limit the scope of the present disclosure.

In the experimental measurements, silicon-nitride (SiN)-based dielectric films formed according to the method 100 described above were exposed to helium-containing high-energy low-dose plasma for a time duration of between about 2 minutes and about 3.5 minutes under a pressure of between 15 and 150 mT. The power applied to an electrode disposed within a substrate support by a bias power source (referred to as a bias power) was varied between 100 W and 700 W to vary the energy of helium ions (i.e., ions generated in a plasma) used to bombard the surface of a substrate due to the applied bias power. The power applied to the RF power source, which in this example was ICP plasma source, was varied between 0 kW and 2.7 kw to vary the density of helium ions generated in the plasma (i.e., the lower power corresponds to a lower flux density). The formed silicon-nitride (SiN)-based dielectric films were bombarded by the helium ions and densified (i.e., nitrided) to a depth of between 2.6 Å and 4.2 Å per cycle and to an overall depth of between 3 nm and 4.2 nm. A summary of some of the process parameters that can be used in one or more of the embodiments described herein are summarized below.

| | |
|---|---|
| Overall nitration Depth (nm) | 3-4.2 |
| Ions | Helium (He) |
| Flux density (ions/cm² · sec) | $5 \times 10^{15}$-$1.37 \times 10^{16}$ |
| Ion energy (eV) | 1-3.01 |
| Bias power (W) | 100-700 |
| RF source power (kW) | 0-2.7 |
| Pressure (mTorr) | 5-300 |
| Temperature | 100-400 |
| Time (minutes/cycle) | 2-3.5 |

Figure 5A:
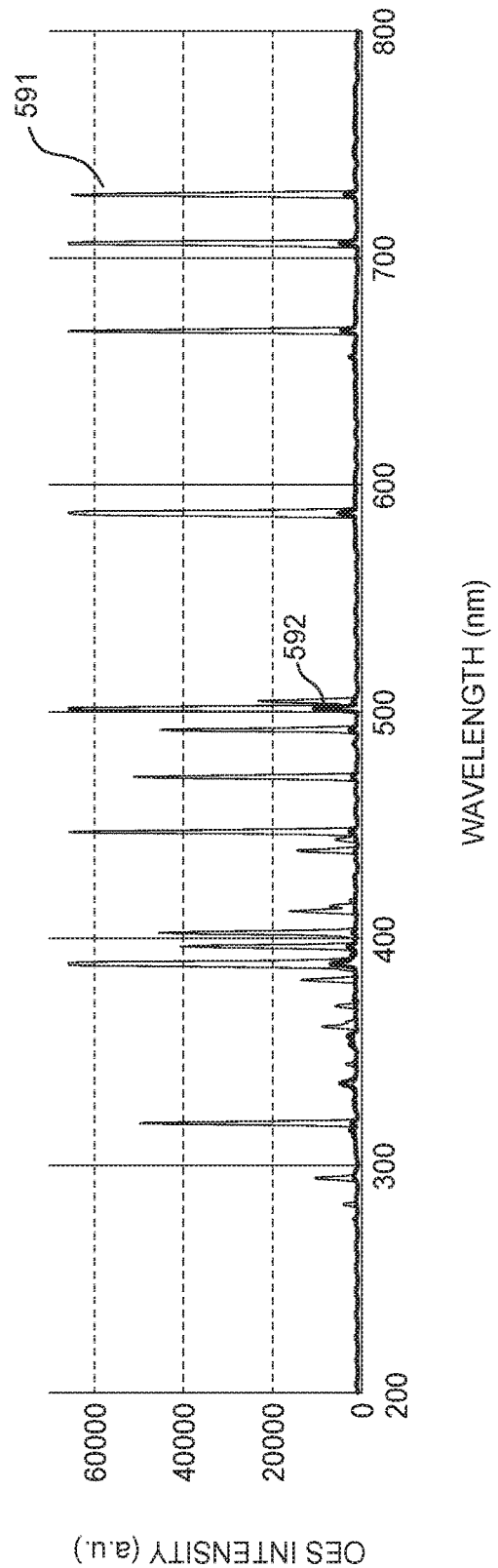
FIGS. 5A and 5B show optical emission spectroscopy (OES) intensity of helium-containing plasma according to one embodiment.

FIG. 5A shows optical emission spectroscopy (OES) intensity of a helium-containing plasma measured between wavelengths 200 and 900 nm at a power of the RF power source (referred to as a RF source power) of (i) 2.7 kW (see line 591) and (ii) 700 W (see line 592). The dominant emission lines in FIG. 5A illustrate the metastable helium (He) atom (e.g., 388.8 nm, 402.6 nm, 447.1 nm, 501.5 nm, 587.5 nm, 667.8 nm, 706.5 nm, and 728.1 nm). In addition, the detected reactive species associated with nitrogen are excited nitrogen molecules that have an optical emission spectra wavelength of between 300 and 400 nm. The OES intensity corresponding to the metastable helium (He) atom in the 700 W RF source power case (see line 591) is about 10 to 1000 times smaller than that in the 2.7 kW RF source power case (see line 592). Thus, the plasma density of the helium ion containing plasma is 10 to 1000 times smaller in the 700 W RF source power case.

Figure 5B:
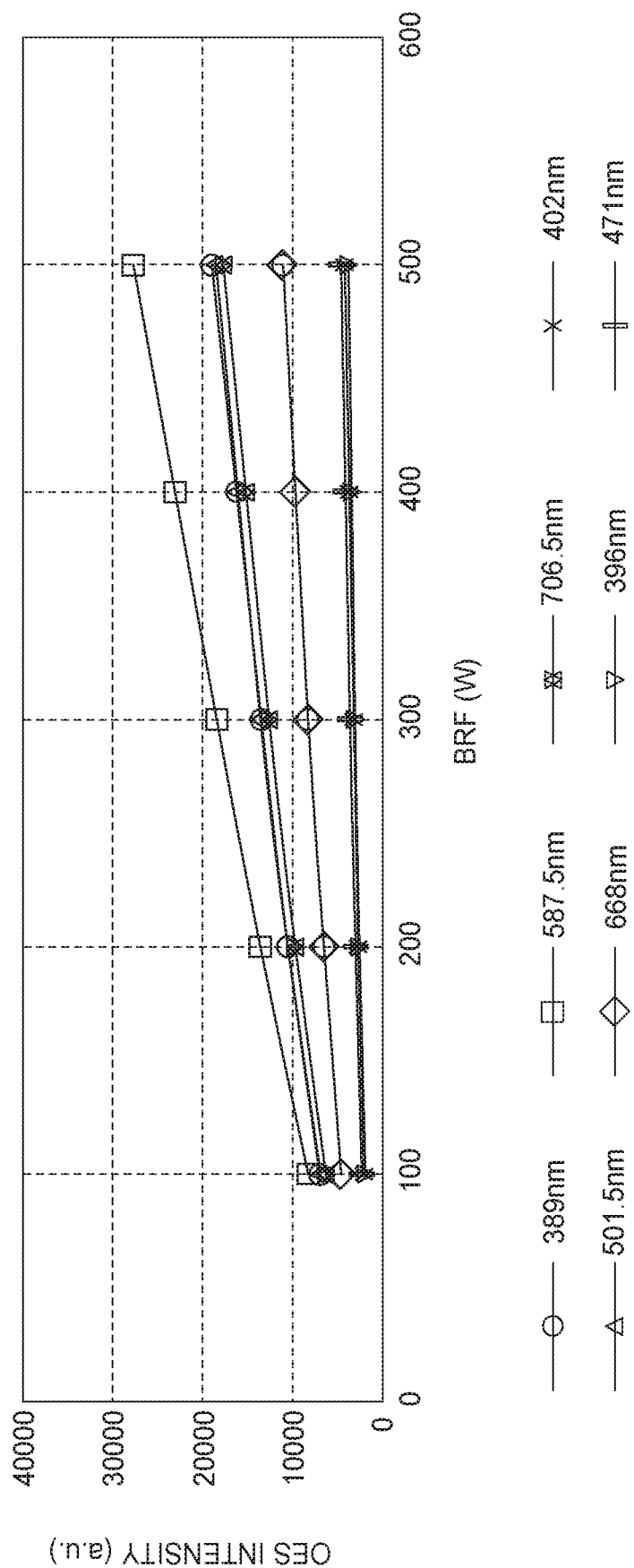

FIG. 5B shows OES intensity of helium-containing plasma at various bias powers, such as between 100 W and 500 W, and at a pressure 150 mTorr. The RF source power was kept at 0 W, and thus the helium-containing plasma was generated by the application of the bias applied to the substrate support electrode. As can be seen from FIG. 5B, the OES intensities corresponding to the dominant emission lines in FIG. 5A increase linearly with the applied bias power, and thus with the energy of the helium ions. Thus, in this example, a high-energy low-dose plasma was provided with a low RF source power (e.g., 700 W) and a high bias power (e.g., 100-500 W).

The helium-containing plasma, in which the plasma density and the energy of the helium ions can be controlled as described above, can be used to densify the formed deposited layers, such as a silicon-nitride (SiN)-based dielectric film. The helium-containing plasma having a low plasma density and containing high energy helium ions, which bombard the substrate surface, can penetrate deeper within silicon-nitride (SiN)-based dielectric films without creating significant damage to the film due to excessive bombardment of the film surface created in higher plasma density processes and the use of higher atomic mass gases typically used in a conventional plasma processes. The helium-containing plasma having a low plasma density and containing high energy helium ions produce an increased thickness densification in the formed silicon-nitride (SiN)-based dielectric films with less overall damage. For example, silicon-and-nitride containing flowable films deposited within high aspect ratio features can be treated with such high energy low dose helium-containing plasma to densify the flowable film to form silicon-nitride (SiN) based dielectric films that are densified to an increased depth within a high aspect ratio feature without significant damage to the formed flowable film layer.

Figure 6:
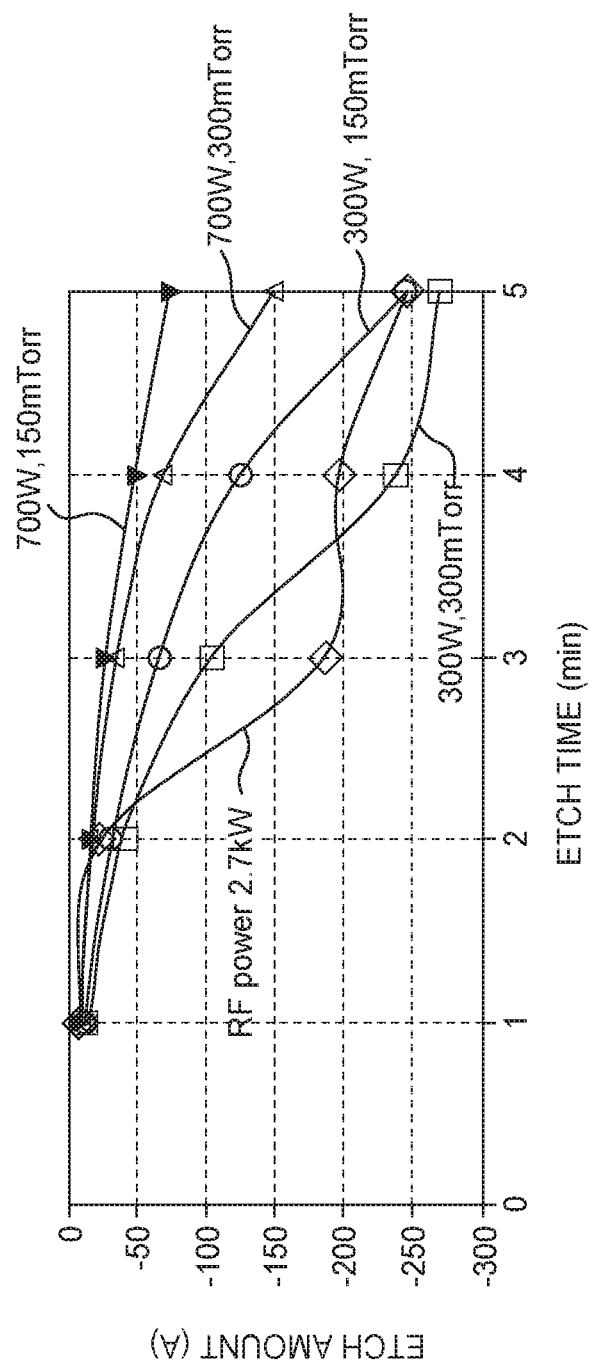
FIG. 6 shows an etch amount of a silicon-nitride (SiN) based dielectric film according to one embodiment.

FIG. 6 shows an amount of a silicon-nitride (SiN)-based dielectric film removed using a dilute HF (DHF) solutions prepared by diluting 1% HF with deionized water for 5 minutes. The silicon-nitride (SiN)-based dielectric film was formed according to the method 100 described above, and subsequently exposed to helium-containing plasma at a RF source power of 2.7 kW (high dose) and 700 W (low dose), at bias power of 300 W (low energy) and 700 W (high energy), at a pressure of 150 mTorr and 300 mTorr. As can be seen in FIG. 6, the lower dose (i.e., at the lower RF source power) and the higher energy (i.e., at the higher bias power) of the helium ions in the plasma increase an etch amount of a silicon-nitride based dielectric film, indicating the formed silicon nitride (SiN)-based dielectric film has nitride (densified) portion to a deeper depth and an etch rate was improved to 12.5 Å/min. A lower pressure also leads to a higher energy of the helium ions in the plasma, and thus an etch rate was improved.

As described above, post-treating silicon-nitride (SiN)-based flowable films with helium-containing high-energy low-dose plasma can increase nitridation depth and improve wet etch rate (WERR) without damaging the flowable films. It should be noted that the particular example embodiments described above are only some possible examples of a silicon nitride (SiN)-based dielectric film that can be post-treated by high-energy low-dose plasma according to the present disclosure and do not limit the possible configurations, specifications, deposition methods, or the like of silicon nitride (SiN)-based dielectric films. For example, post-treatment by high-energy low-dose plasma including light ions can be applied to any doped or un-doped SiCOH, SiCON, SiO, and SiN films.

While the foregoing is directed to specific embodiments, other and further embodiments may be devised without departing from the basic scope thereof, and the scope thereof is determined by the claims that follow.

The invention claimed is:

1. A method of post-treating a silicon nitride (SiN)-based dielectric film formed on a surface of a substrate, comprising:
   positioning a substrate having a silicon nitride (SiN)-based dielectric film formed thereon in a processing chamber; and
   exposing the silicon nitride (SiN)-based dielectric film to helium-containing plasma in the processing chamber, wherein
   energy of helium ions in the helium-containing plasma is between 1 eV and 3.01 eV, and
   flux density of the helium ions in the helium-containing plasma is between $5 \times 10^{15}$ ions/cm²·sec and $1.37 \times 10^{16}$ ions/cm²·sec.

2. The method according to claim 1, wherein the silicon nitride (SiN)-based dielectric film comprises Si—H bonds.

3. The method according to claim 1, wherein the silicon nitride (SiN)-based dielectric film comprises N—H bonds.

4. The method according to claim 1, wherein the substrate is at a temperature between 10° C. and 200° C. during the exposure of the silicon nitride (SiN)-based dielectric film to the helium-containing plasma.

5. The method according to claim 1, wherein the processing chamber is at a pressure between 15 mTorr and 300 mTorr during the exposure of the silicon nitride (SiN)-based dielectric film to the helium-containing plasma.

6. The method according to claim 1, wherein the substrate is made of a material selected from the group consisting of metal, semiconductor, and plastic.

7. A method of post-treating a silicon-based film formed on a surface of a substrate, comprising:
   positioning a substrate having a silicon-based film formed thereon in a processing chamber; and
   exposing the silicon-based film to helium-containing plasma in the processing chamber, wherein energy of helium ions in the helium-containing plasma is between 1 eV and 3.01 eV, and flux density of the helium ions in the helium-containing plasma is between $5\times10^{15}$ ions/cm$^2$·sec and $1.37\times10^{16}$ ions/cm$^2$·sec.

8. The method according to claim 7, wherein the silicon-based film comprises Si—H bonds.

9. The method according to claim 7, wherein the silicon-based film comprises N—H bonds.

10. The method according to claim 7, wherein the substrate is at a temperature between 10° C. and 200° C. during the exposure of the silicon-based film to the helium-containing plasma.

11. The method according to claim 7, wherein the processing chamber is at a pressure between 15 mTorr and 300 mTorr during the exposure of the silicon-based film to the helium-containing plasma.

12. The method according to claim 7, wherein the substrate is made of a material selected from the group consisting of metal, semiconductor, and plastic.

13. A method of forming and post-treating a silicon nitride (SiN)-based dielectric film on a surface of a substrate, comprising:

delivering a dielectric precursor onto a substrate disposed in a processing region of a first chamber, the dielectric precursor comprising silicon and nitrogen;

providing radical flux in the processing region of the first chamber; and exposing the delivered dielectric precursor to helium-containing plasma in a second chamber, wherein energy of helium ions in the helium-containing plasma is between 1 eV and 3.01 eV, and flux density of the helium ions in the helium-containing plasma is between $5\times10^{15}$ ions/cm$^2$·sec and $1.37\times10^{16}$ ions/cm$^2$·sec.

14. The method according to claim 13, wherein the substrate is at a temperature between 10° C. and 200° C. during the exposure of the silicon nitride (SIN)-based dielectric film to the helium-containing plasma.

15. The method according to claim 13, wherein the processing chamber is at a pressure between 15 mTorr and 300 mTorr during the exposure of the silicon nitride (SiN)-based dielectric film to the helium-containing plasma.

16. The method according to claim 13, wherein the substrate is made of a material selected from the group consisting of metal, semiconductor, and plastic.

17. The method according to claim 13, wherein the dielectric precursor is an organosilicon compound that includes silicon, nitrogen, hydrogen, and chlorine.

18. The method according to claim 13, wherein the dielectric precursor is an organosilicon compound that includes silicon, nitrogen, hydrogen, and oxygen.

19. The method according to claim 13, wherein the radical flux comprises radical gas selected from the group consisting of oxygen ($O_2$), ozone ($O_3$), water ($H_2O$), ammonia ($NH_3$), hydrazine ($N_2H_4$), nitrogen dioxide ($NO_2$), nitrogen ($N_2$), propylene ($C_3H_6$), and acetylene ($C_2H_2$).

* * * * *